(12) United States Patent
Evers et al.

(10) Patent No.: US 10,941,833 B2
(45) Date of Patent: Mar. 9, 2021

(54) VIBRATION ISOLATOR WITH A VERTICALLY EFFECTIVE PNEUMATIC SPRING

(71) Applicant: Integrated Dynamics Engineering GmbH, Raunheim (DE)

(72) Inventors: Arndt Evers, Oestrich-Winkel (DE); Frank Hofmann, Rosbach (DE)

(73) Assignee: Integrated Dynamics Engineering GmbH, Raunheim (DE)

( * ) Notice: Subject to any disclaimer, the term of this patent is extended or adjusted under 35 U.S.C. 154(b) by 750 days.

(21) Appl. No.: 15/333,641

(22) Filed: Oct. 25, 2016

(65) Prior Publication Data

US 2017/0175845 A1    Jun. 22, 2017

(30) Foreign Application Priority Data

Dec. 16, 2015   (EP) .................................. 15 200 391

(51) Int. Cl.
| | |
|---|---|
| *F16F 15/023* | (2006.01) |
| *G03F 7/20* | (2006.01) |
| *F16F 15/03* | (2006.01) |
| *F16F 15/027* | (2006.01) |
| *F16F 9/02* | (2006.01) |
| *F16F 15/02* | (2006.01) |

(52) U.S. Cl.
CPC ........ *F16F 15/0232* (2013.01); *F16F 9/0218* (2013.01); *F16F 9/0281* (2013.01); *F16F 15/022* (2013.01); *F16F 15/027* (2013.01); *F16F 15/0275* (2013.01); *F16F 15/03* (2013.01); *G03F 7/709* (2013.01); *G03F 7/70833* (2013.01)

(58) Field of Classification Search
CPC ...... F16F 9/0218; F16F 9/0281; F16F 15/022; F16F 15/0232; F16F 15/0275; F16F 15/046; F16F 13/002; F16F 15/027; F16F 15/03; G03F 7/709; G03F 7/70833; G03F 7/70
USPC ............................ 188/266; 267/140.3, 64.24
See application file for complete search history.

(56) References Cited

U.S. PATENT DOCUMENTS

| | | | |
|---|---|---|---|
| 3,889,936 | A | 6/1975 | Shimizu |
| 5,038,835 | A | 8/1991 | Breyer |
| 5,090,299 | A | 2/1992 | Santi et al. |
| 5,111,735 | A | 5/1992 | Johnson |
| 5,121,898 | A | 6/1992 | Yasuda et al. |
| 5,267,725 | A | 12/1993 | Wode et al. |

(Continued)

FOREIGN PATENT DOCUMENTS

| | | |
|---|---|---|
| DE | 8900312 U1 | 6/1989 |
| DE | 4241997 C1 | 5/1994 |

(Continued)

OTHER PUBLICATIONS

Office Action received for European Patent Application No. 15200391.9, dated Jun. 1, 2016, 06 pages.

(Continued)

*Primary Examiner* — Robert A. Siconolfi
*Assistant Examiner* — San M Aung
(74) *Attorney, Agent, or Firm* — Kaplan Breyer Schwarz, LLP

(57) ABSTRACT

A vibration isolator with a pneumatic spring that is effective only in vertical direction, the pneumatic spring including a working space in which a vertically effective actuator is disposed.

12 Claims, 4 Drawing Sheets

(56) References Cited

U.S. PATENT DOCUMENTS

| | | | | |
|---|---|---|---|---|
| 5,779,010 | A * | 7/1998 | Nelson | F16F 15/02 188/378 |
| 6,126,137 | A * | 10/2000 | Helms | F16F 9/103 248/563 |
| 6,322,060 | B1 | 11/2001 | Mayama et al. | |
| 6,746,005 | B1 | 6/2004 | Su et al. | |
| 6,926,263 | B1 * | 8/2005 | Nelson | F16F 15/0232 267/121 |
| 7,095,482 | B2 | 8/2006 | Phillips et al. | |
| 7,125,008 | B2 | 10/2006 | Hayashi et al. | |
| 7,320,414 | B2 | 1/2008 | Davis | |
| 7,552,620 | B2 | 6/2009 | Deroos et al. | |
| 8,387,958 | B2 | 3/2013 | Heiland | |
| 8,556,047 | B2 | 10/2013 | Kondou et al. | |
| 8,567,303 | B2 | 10/2013 | Ingersoll et al. | |
| 9,618,076 | B2 | 4/2017 | Kropp et al. | |
| 10,480,609 | B2 | 11/2019 | Evers et al. | |
| 10,634,210 | B2 | 4/2020 | Evers et al. | |
| 2004/0065517 | A1 * | 4/2004 | Watson | F16F 15/0232 188/378 |
| 2005/0211515 | A1 * | 9/2005 | Hata | F16F 15/0275 188/266.7 |
| 2006/0042059 | A1 | 3/2006 | Satoh et al. | |
| 2007/0241489 | A1 * | 10/2007 | Mizushima | F16F 15/03 267/140.14 |
| 2007/0246871 | A1 | 10/2007 | Hayashi | |
| 2007/0272820 | A1 * | 11/2007 | Heiland | G03F 7/709 248/636 |
| 2008/0013060 | A1 * | 1/2008 | Ichinose | F16C 32/0614 355/53 |
| 2009/0195767 | A1 * | 8/2009 | Yoshida | G03B 27/58 355/72 |
| 2009/0283942 | A1 | 11/2009 | Nakamura | |
| 2010/0001445 | A1 | 1/2010 | Maruyama et al. | |
| 2014/0209778 | A1 * | 7/2014 | Evers | F16F 1/121 248/550 |
| 2014/0209779 | A1 * | 7/2014 | Kropp | F16F 15/022 248/550 |
| 2015/0219179 | A1 | 8/2015 | Cui et al. | |
| 2015/0260255 | A1 | 9/2015 | Tan et al. | |
| 2016/0084339 | A1 | 3/2016 | Evers | |
| 2017/0175845 | A1 | 6/2017 | Evers et al. | |
| 2017/0370441 | A1 | 12/2017 | Evers et al. | |
| 2017/0370442 | A1 | 12/2017 | Evers et al. | |

FOREIGN PATENT DOCUMENTS

| | | |
|---|---|---|
| DE | 4324595 C1 | 12/1994 |
| EP | 1803963 A1 | 7/2007 |
| EP | 1803964 A2 | 7/2007 |
| EP | 2759736 A1 | 7/2014 |
| EP | 2998611 A1 | 3/2016 |
| FR | 2993943 A1 | 1/2014 |
| JP | 11-294520 A | 10/1999 |
| JP | 2000-220690 A | 8/2000 |
| JP | 2001-263415 A | 9/2001 |
| JP | 2005-282696 A | 10/2005 |
| JP | 2010-127383 A | 6/2010 |
| SU | 612087 A1 | 6/1978 |
| WO | 2008/038433 A1 | 4/2008 |

OTHER PUBLICATIONS

Communication from the Examining Division dated Jan. 4, 2019 for EP Application No. 15200391.
Annex to the communication dated Jan. 4, 2019 for EP Application No. 15200391.
English Translation of EP Office Action received for European Patent Application No. 15200391.9, dated Nov. 15, 2019, 21 pages.
Office Action received for European Patent Application No. 15200391.9, dated Jan. 4, 2019, 5 pages.
Communication from the Examining Division received for EP Patent Application No. 16175910.5 (foreign counter-part of related U.S. Appl. No. 15/619,088), dated Aug. 27, 2018, 2 pages.
Examiner initiated interview summary received for U.S. Appl. No. 15/619,088, dated Dec. 19, 2019, 1 page.
"Search Report" issued in counterpart EP Application No. 16175909.7, dated Jan. 10, 2017.
"Search Report" issued in related co-pending EP patent application No. 16175910.5, dated Feb. 2, 2017.
Final Office Action issued in U.S. Appl. No. 15/619,211, Nov. 8, 2018, 6 pp.
Final Rejection received for U.S. Appl. No. 15/619,088, dated Aug. 21, 2019, 8 pages.
Non Final Office Action dated May 29, 2018 in U.S. Appl. No. 15/619,211, dated May 29, 2018.
Non-Final Office Action received for related U.S. Appl. No. 15/619,088, dated Oct. 4, 2018, 14 pages.
Non-Final Rejection received for U.S. Appl. No. 15/619,088, dated Apr. 26, 2019, 10 pages.
Notice of Allowance and Fees Due (PTOL-85) received for U.S. Appl. No. 15/619,211, dated Apr. 2, 2019, 8 pages.
Notice of Allowance and Fees Due (PTOL-85) received for U.S. Appl. No. 15/619,211, dated Jan. 28, 2019, 6 pages.
Notice of Allowance received for U.S. Appl. No. 15/619,088, dated Dec. 19, 2019, 8 pages.
Notice of Allowance received for U.S. Appl. No. 15/619,211, dated Jul. 17, 2019, 8 pages.
Office Action issued in related Japanese Patent Application No. 2016-240946 dated Oct. 9, 2020 and English Translation thereof.

* cited by examiner

VIBRATION ISOLATOR WITH A VERTICALLY EFFECTIVE PNEUMATIC SPRING

European Patent Application No. 15 200 391.9 is incorporated herein by reference.

FIELD OF THE INVENTION

The invention relates to a vibration isolator with a pneumatic spring that is effective only in vertical direction. More particularly, the invention relates to a vibration isolator that is used in a stationary vibration isolation system for supporting equipment in the semiconductor industry, for example lithography equipment, optical inspection equipment, and wafer handling equipment.

BACKGROUND OF THE INVENTION

Active and passive vibration isolation systems based on pneumatic springs are known. With the passive transmission characteristics of an air spring, vibration isolation from the ground is achieved already above the natural frequency of the mass-spring system. Only in a range around the natural frequency an increase in the vibration amplitude arises, which may be quite large depending on the damping of the vibration.

Such passive systems including pneumatic isolators have therefore been enhanced by active control. In particular, for this purpose, sensors are placed on the load to be isolated for measuring acceleration, velocity or the distance to ground to drive usually non-contact actuators which exert compensating forces on the system.

Pneumatic springs are usually adapted depending on the mass of the load to be supported. In some cases, in particular if the load to be supported changes, level control is additionally employed, which controls air supply and air extraction using a level control valve. Thus, the air springs are integrated in the control system of an active vibration isolation system.

The non-contact actuators which are otherwise used to control the system are mostly based on the Lorentz principle and consist of a moving coil and a permanent magnet. One component is mounted on the supported load and the other is coupled to ground.

In case of large changes of the load, height control via solenoid actuators and level control of a pneumatic spring reaches limits.

The published patent application EP 2 759 763 A2 (Integrated Dynamics Engineering GmbH), however, discloses a coil spring for vertical isolation which is adjustable in height. The coil spring is stiffly connected to the base or to the load to be isolated in horizontal direction thereby enabling to accomplish height adjustment without causing a shift of the load to be isolated in horizontal direction.

However, such purely mechanical springs exhibit a response behavior which is so different from the response behavior of a pneumatic spring that for many applications a purely mechanical spring does not come into consideration.

It is difficult to provide a pneumatic isolation system which is also suitable for applications in which the load to be isolated is a high moving mass and/or exerts a high acceleration of the moving mass on the system. Large forces are required in this case, which is only feasible to a limited extend, due to limited space and possibly a combined vertical and horizontal movement.

SUMMARY OF THE INVENTION

The invention is based on the object to mitigate the mentioned drawbacks of the prior art.

More particularly it is an object of the invention to provide a vibration isolator which is suitable for an active vibration isolation system and which is able to produce high compensation forces in a compact space.

The object of the invention is already achieved by a vibration isolator and a vibration isolation system in accordance with an illustrative embodiment of the invention.

The invention relates to a vibration isolator which in particular forms part of a vibration isolation system that is installed stationary and is used for supporting equipment in semiconductor industry. Generally, such a vibration isolation system comprising a table or frame mounted with vibration isolation, on which the relevant equipment is supported.

The vibration isolator comprises a pneumatic spring that is effective only in vertical direction.

The pneumatic spring is in particular stiffly connected to the base or to the load to be isolated in horizontal direction and therefore provides isolation only in the vertical direction. The terms "horizontal" and "vertical" refer to the orientation in the installed state.

Preferably, the vibration isolator comprises a further component for horizontal isolation. The further component for horizontal isolation may in particular be a flexible rod or a buckling pendulum.

According to the invention at least one actuator effective in vertical direction is arranged in the working space of the pneumatic spring.

The use of an actuator effective in vertical direction, in particular of a solenoid actuator allows for additional vibration isolation in vertical direction without change of the installation space. The actuator is in particular used for active vibration isolation.

The actuator which is preferably formed of a coil and a permanent magnet benefits from the fact that the opposing components of the pneumatic spring, in particular an inner housing and an outer housing, do not move in the horizontal direction.

A gap existing between the coil and the magnet may therefore be particularly narrow, in particular with a width of less than 5 mm, preferably less than 1 mm, and more preferably less than 0.5 mm.

This permits to generate large forces within the working space of the pneumatic spring.

In a preferred embodiment of the invention, the flexible rod or the buckling pendulum is arranged in an inner housing of the vibration isolator which protrudes into the working space of the pneumatic spring.

The flexible rod or the buckling pendulum is therefore arranged outside of the working space of the pneumatic spring, but protrudes into the working space of the pneumatic spring through an inner housing that forms an extension of the load to be isolated and has a tubular design, in particular at least in sections thereof, which also enables a compact design of the system.

Preferably, the coil of the actuator extends around the inner housing, in particular it is pressed onto the inner housing or glued onto the housing, and a magnet, in particular a permanent magnet extends along the outer housing. The magnet in particular has an annular shape, and in its installed state the coil moves in the magnet.

It will be appreciated that, as contemplated according to an alternative embodiment of the invention, it is as well conceivable to have a reverse design, that is to apply the magnet of the actuator to the inner housing and the coil to the outer housing.

In a further embodiment of the invention the isolator comprises a plurality of actuators, in particular of solenoid actuators, which are superposed. In one embodiment the vibration isolator comprises at least three superposed magnetic actuators. This also permits to produce large forces in a compact space.

The rigid coupling of the pneumatic spring in the horizontal direction may in particular be achieved by at least one leaf spring which is connected in parallel to the pneumatic spring.

The leaf spring may in particular be arranged in the working space of the pneumatic spring to interconnect an inner housing and an outer housing which enclose the working space.

Preferably, the vibration isolator comprises at least two leaf springs spaced apart vertically in order to prevent tilting of the inner housing relative to the outer housing.

The leaf spring may be part of a leaf spring assembly.

In particular segmented leaf springs formed of ring segments may be used.

The leaf springs are preferably replaceable. This allows to easily adjust in particular the natural frequency of the vibration isolator. In particular it is possible to achieve a natural frequency of more than 5 Hz in order to obtain short settling times.

If the vibration isolator according to the invention forms part of a vibration isolation system, it is in particular possible to use the space saved due to the integration of the actuator in the working space for at least one further actuator which is arranged outside of the outer housing of the actuator and is effective in horizontal direction.

BRIEF DESCRIPTION OF THE DRAWINGS

The subject matter of the invention will now be described in more detail with reference to the drawings of FIGS. 1 to 4.

DETAILED DESCRIPTION

Figure 1:
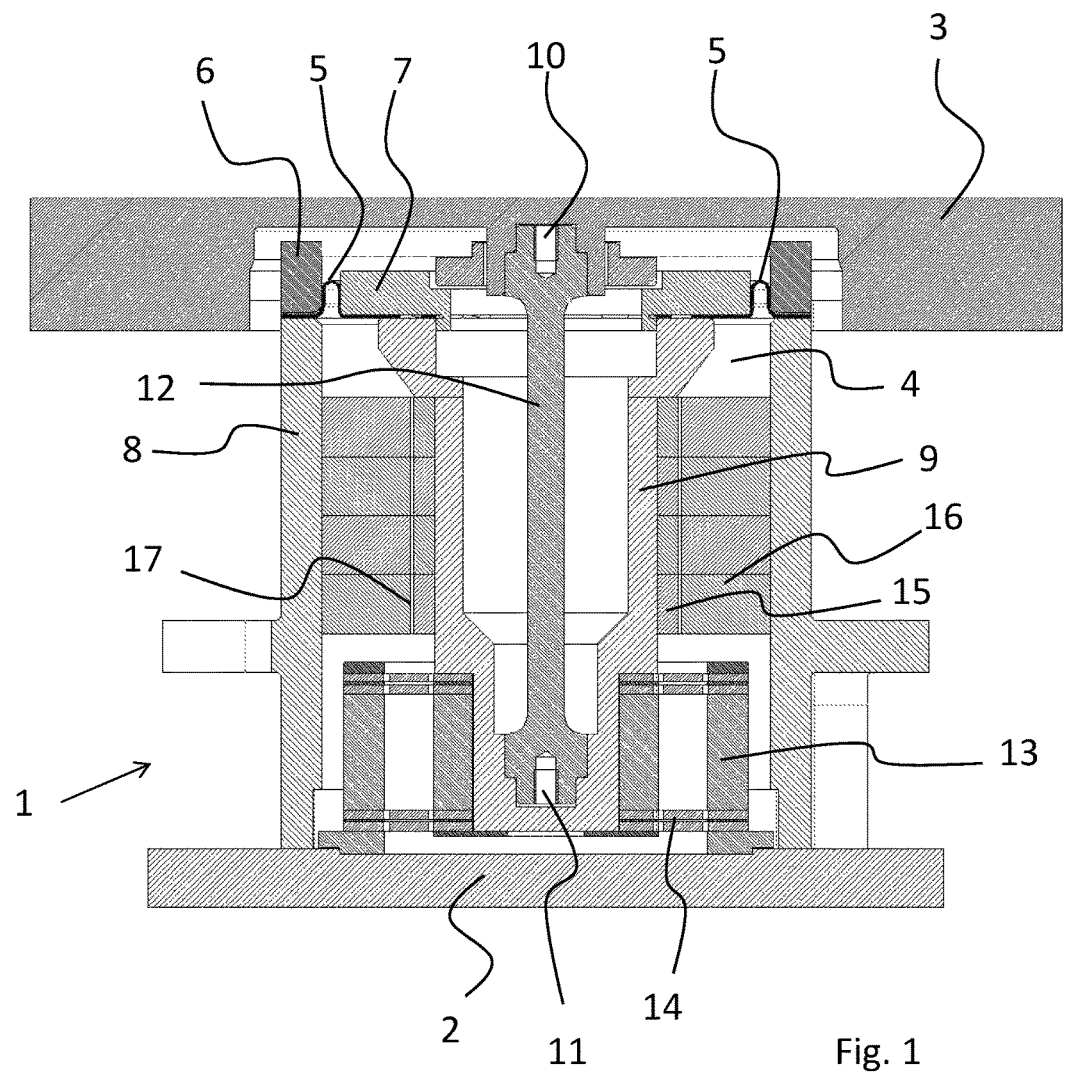
FIG. 1 shows a schematic sectional view of a vibration isolator according to the invention.

FIG. 1 is a schematic sectional view illustrating a vibration isolator 1 according to the invention. Vibration isolator 1 is configured as a pneumatic spring having a working space 4 and comprising a base part 2 and a head part 3 which is in particular designed as a piston plate and is connected to the load to be isolated or is part of the load to be isolated.

The pneumatic spring comprises an outer housing 8 mounted on the base part 2 and an inner housing 9. Outer housing 8 and inner housing 9 are closed by an elastic membrane 5. Membrane 5 is secured to the outer housing by means of clamping ring 6 and to the inner housing 9 by means of clamping ring 7.

Due to the pressure prevailing in the working space 4, which can be controlled via a pneumatic control valve (not illustrated), the inner housing 9 is supported pneumatically relative to the outer housing 8 and is movable in the vertical direction due to the elasticity of the membrane 5.

In order to couple the pneumatic spring to the base part 2 with rigidity in the horizontal direction, a leaf spring assembly 13 comprising a plurality of leaf springs 14 spaced apart in the vertical direction is provided between the inner housing 9 and the outer housing 8.

In the present exemplary embodiment, the connection of inner housing 9 and outer housing 8 is accomplished by fastening of the leaf spring assembly 13 to the base part 2.

For an isolation effect in the horizontal direction, a bending rod 12 is provided which is connected to the head part by screw 10 and to the inner housing 9 by screw 11.

Inner housing 9 has a cup-like shape, at least in sections thereof, and extends from head part 3 into the working space 4 of the pneumatic spring. This provides for a compact design and at the same time the buckling point is shifted downwards whereby the system is stabilized.

The outer surface of inner housing 9 has a circular cylindrical shape, at least in sections thereof, and has at least one coil 15 applied thereon. In the present exemplary embodiment a plurality of coils 15 are clamped to the inner housing 9 in superposed relationship.

To form a solenoid actuator, annular magnets 16 are installed in the outer housing 8 opposed to coils 15. Respective opposing coils 15 and magnets 16 define a solenoid actuator.

This allows for a simple implementation and optionally for retrofitting into a vibration isolator as well.

Preferably, first coils 15 are mounted to the inner housing 9 and then magnets 16 are mounted to the outer housing 8, and then these two assemblies are combined.

Since the pneumatic spring is effective only in vertical direction, the gap between coil 15 and magnet 16 is narrow, which permits to generate a large force in a compact space.

Figure 2:
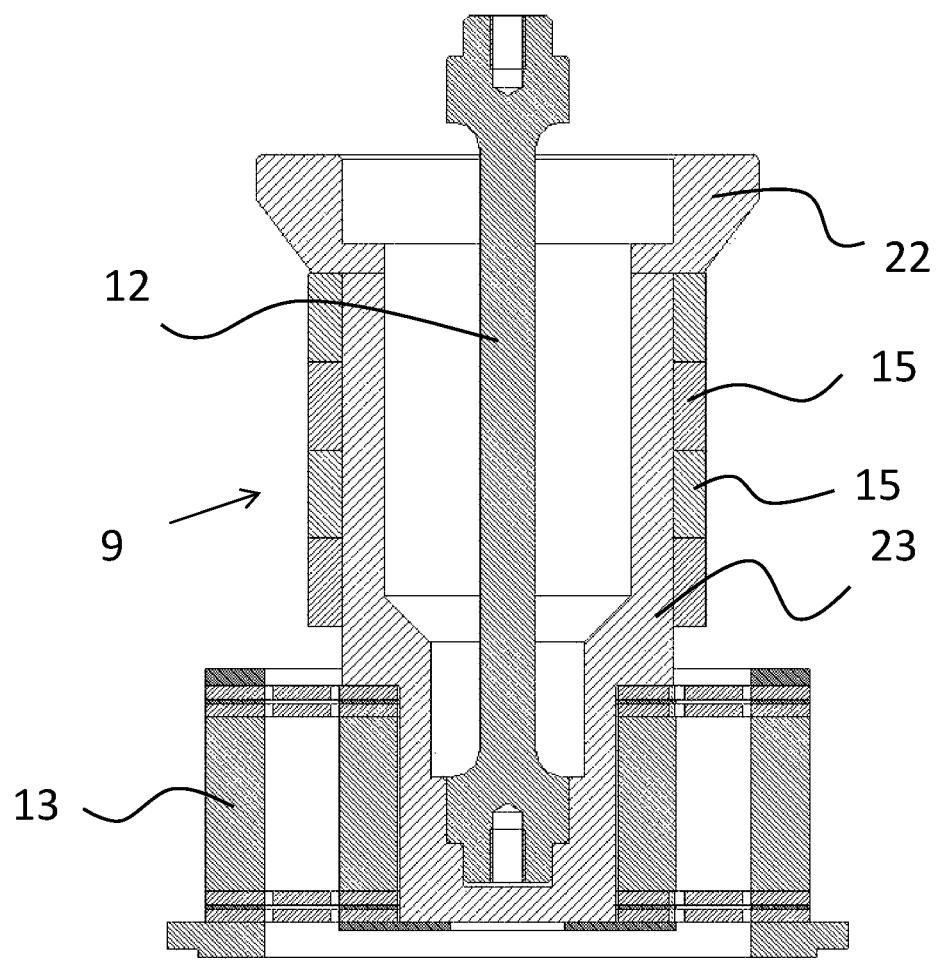
FIG. 2 shows a view of the inner housing.

FIG. 2 shows a schematic sectional view of the preassembled inner housing of the vibration isolator illustrated in FIG. 1.

Coils 15 are clamped onto the inner housing 9.

Inner housing 9 comprises a lower part 23 and an upper part 22 mounted thereon which may serve as an abutment for coils 15.

The lower part 23 narrows in the region of leaf spring assembly 13.

Otherwise inner housing 9 is cup-shaped, and flexible rod 12 is fixed to the bottom of inner housing 9.

Figure 3:
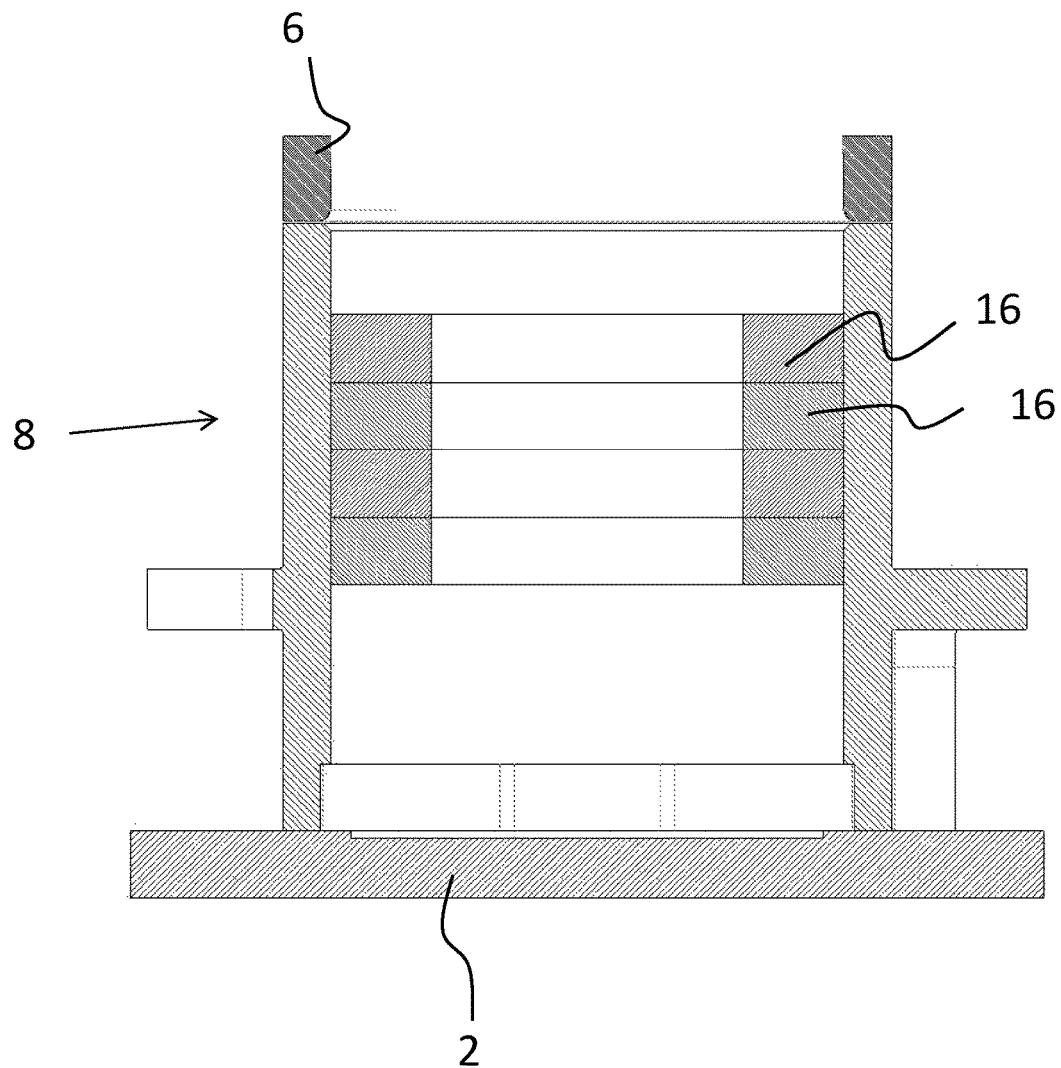
FIG. 3 shows a view of the outer housing.

FIG. 3 shows a schematic sectional view of outer housing 8.

It can be seen that annular magnets 16 are inserted into the outer housing 8 having a circular cylindrical shape. They may be secured thereto by an adhesive bond (not shown), for example.

Furthermore, clamping ring 6 can be seen arranged on top, which serves to secure the membrane (5 in FIG. 1). It will be understood that this clamping ring 6 has to be removed for assembly.

Figure 4:
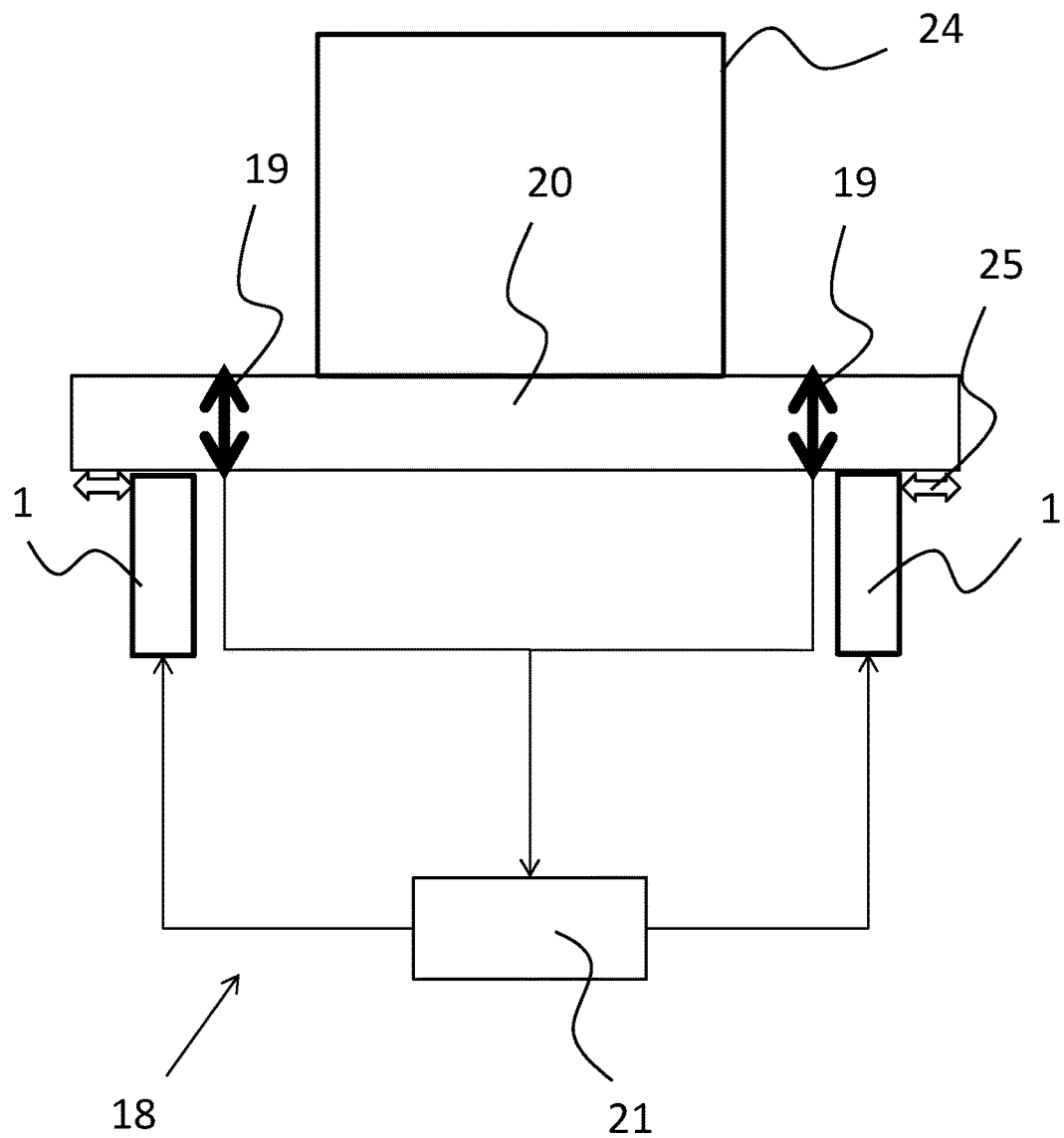
FIG. 4 is a schematic view of a vibration isolation system which is equipped with actuators according to the invention.

FIG. 4 shows a schematic view of a vibration isolation system 18 which comprises a table 20 mounted for vibration isolation, on which equipment for processing semiconductor devices 24 is arranged.

On table 20, sensors 19 are arranged which detect vibrations of the load to be isolated and which may be implemented in the form of velocity, acceleration, or distance sensors.

Sensors 19 are coupled to a control device 21 which drives the vibration isolators 1 on which the table 20 is supported.

In the present exemplary embodiment, control device 21 controls both a pneumatic control valve for the pneumatic spring and the solenoid actuator provided within the vibration isolator 1.

Outside of the housing of vibration isolator 1, actuators 25 are arranged which enable active control in horizontal direction. These actuators are also actively controlled on the basis of sensors. The corresponding control loop is not illustrated here.

The invention permits to provide, within a compact space, a vibration isolator operating on the pneumatic principle and enabling active control with large control forces.

LIST OF REFERENCE NUMERALS

1 Vibration isolator
2 Base part
3 Head part
4 Working space
5 Membrane
6 Clamping ring
7 Clamping ring
8 Outer housing
9 Inner housing
10 Screw
11 Screw
12 Flexible rod
13 Leaf spring assembly
14 Leaf spring
15 Coil
16 Magnet
17 Gap
18 Vibration isolation system
19 Sensor
20 Table
21 Control device
22 Upper part
23 Lower part
24 Apparatus for processing semiconductor devices
25 Actuator

What is claimed is:

1. A vibration isolator comprising:
a pneumatic spring that is effective only in a vertical direction, the pneumatic spring having a working space, wherein at least one actuator effective in the vertical direction is arranged in the working space, wherein the vibration isolator comprises a flexible rod or buckling pendulum for vibration isolation in a horizontal direction, wherein the flexible rod or the buckling pendulum is arranged in an inner housing of the vibration isolator, which projects into the working space of the pneumatic spring.

2. The vibration isolator as claimed in claim 1, wherein the actuator is implemented as a solenoid actuator.

3. The vibration isolator as claimed in claim 1, wherein the vibration isolator has an inner housing and an outer housing with the working space disposed therebetween.

4. The vibration isolator as claimed in claim 3, wherein at least one coil extends around the inner housing and at least one magnet extends along the outer housing.

5. The vibration isolator as claimed in claim 3, comprising a plurality of actuators that are superposed.

6. The vibration isolator as claimed in claim 1, wherein the actuator is implemented as a solenoid actuator and comprises a coil and a magnet, wherein a gap between the coil and the magnet has a width of less than 5 mm.

7. The vibration isolator as claimed in claim 1, comprising at least one leaf spring arranged in the working space of the pneumatic spring, which is connected in parallel to the pneumatic spring.

8. The vibration isolator as claimed in claim 7, wherein the leaf spring is part of a leaf spring assembly.

9. A vibration isolation system, comprising at least one vibration isolator as claimed in claim 1.

10. The vibration isolation system as claimed in claim 9, wherein the vibration isolation system comprises equipment for processing semiconductor devices.

11. The vibration isolation system as claimed in claim 9, wherein the vibration isolation system comprises at least one sensor for detecting vibrations of a load mounted for vibration isolation or of the ground on which the vibration isolation system is disposed, and a control device for actively controlling the pneumatic spring or the actuator on the basis of signals from the at least one sensor.

12. The vibration isolation system as claimed in claim 9, further comprising at least one further actuator which is arranged outside of an outer housing of the actuator and is effective in the horizontal direction.

* * * * *